(12) United States Patent
Alshinnawi et al.

(10) Patent No.: US 9,058,156 B2
(45) Date of Patent: Jun. 16, 2015

(54) DETERMINING REDUNDANCY IN A POWER DISTRIBUTION SYSTEM

(71) Applicant: International Business Machines Corporation, Armonk, NY (US)

(72) Inventors: Shareef F. Alshinnawi, Durham, NC (US); Gary D. Cudak, Creedmoor, NC (US); Edward S. Suffern, Chapel Hill, NC (US); J. Mark Weber, Wake Forest, NC (US); Andrew H. Wray, Hillsborough, NC (US)

(73) Assignee: Lenovo Enterprise Solutions (Singapore) Pte. Ltd., Singapore (SG)

( * ) Notice: Subject to any disclaimer, the term of this patent is extended or adjusted under 35 U.S.C. 154(b) by 372 days.

(21) Appl. No.: 13/726,948

(22) Filed: Dec. 26, 2012

(65) Prior Publication Data

US 2014/0181564 A1    Jun. 26, 2014

(51) Int. Cl.
   *G06F 1/18* (2006.01)
   *G06F 1/26* (2006.01)
   *G06F 11/20* (2006.01)
   *H05K 7/14* (2006.01)

(52) U.S. Cl.
   CPC ........ *G06F 1/189* (2013.01); *G06F 1/26* (2013.01); *G06F 11/2015* (2013.01); *H05K 7/1492* (2013.01)

(58) Field of Classification Search
   CPC ....... G06F 1/189; G06F 1/26; G06F 11/2015; H05K 7/1492
   See application file for complete search history.

(56) References Cited

U.S. PATENT DOCUMENTS

| | | | |
|---|---|---|---|
| 6,785,827 B2 | 8/2004 | Layton et al. | |
| 7,030,771 B2 | 4/2006 | Kinnard et al. | |
| 7,152,174 B2 | 12/2006 | Needham et al. | |
| 7,295,935 B2 | 11/2007 | Kasprzak et al. | |
| 7,877,622 B2 | 1/2011 | Gruendler | |
| 8,214,681 B2 | 7/2012 | Suzuki | |
| 8,219,839 B2 | 7/2012 | Akimoto | |
| 8,497,779 B1 * | 7/2013 | Waide | 340/636.1 |
| 8,635,484 B2 * | 1/2014 | Turicchi et al. | 713/340 |
| 2002/0066045 A1 | 5/2002 | Layton et al. | |

(Continued)

FOREIGN PATENT DOCUMENTS

WO    WO 2010114531 A1 *   10/2010

OTHER PUBLICATIONS

IBM TDB; Morin "Redundant Power Supply", IPCOM000064227D, TDB 06-85 p. 274, Jun. 1, 1985, ip.com Prior Art Database—Technical Disclosure, Feb. 18, 2005, 3 pages.

(Continued)

*Primary Examiner* — Stefan Stoynov
(74) *Attorney, Agent, or Firm* — Katherine S. Brown; Jeffrey L. Streets

(57) ABSTRACT

A computer-implemented method identifies the path of a first power circuit to a first power supply that is connected to supply power to an electronic device, and identifies the path of a second power circuit to a second power supply that is connected to supply power to the electronic device. The method then compares the path of the first power distribution circuit with the path of the second power distribution circuit to determine a measure of redundancy in the first and second distribution paths. A measure of redundancy may then be output to a user.

21 Claims, 14 Drawing Sheets

(56) References Cited

U.S. PATENT DOCUMENTS

| | | |
|---|---|---|
| 2007/0102998 A1* | 5/2007 | Jordan et al. .................. 307/9.1 |
| 2009/0287943 A1 | 11/2009 | Brey et al. |
| 2011/0320827 A1 | 12/2011 | Siegman et al. |
| 2012/0239958 A1 | 9/2012 | Archibald et al. |
| 2013/0047002 A1* | 2/2013 | Liu .............................. 713/300 |
| 2014/0115353 A1* | 4/2014 | Hutten et al. ................ 713/310 |

OTHER PUBLICATIONS

IBM TDB; Brown et al. "Software Design to Support Concurrent Maintenance", IPCOM000107367D, TDG n9 02-92 p. 300-301, ip.com Prior Art Database—Technical Disclosure, Feb. 1, 1992, 3 pages.

* cited by examiner

US 9,058,156 B2

DETERMINING REDUNDANCY IN A POWER DISTRIBUTION SYSTEM

BACKGROUND

1. Field of the Invention

The present invention relates to power distribution systems for a computing cluster and methods of monitoring the redundant distribution of electrical power to the devices in a computing cluster.

2. Background of the Related Art

A large computing cluster may consume a large amount of electrical power. The various components responsible for supplying the power to each entity in the computing cluster are referred to collectively as a power distribution system. The power distribution system may be specifically designed for the demands of a particular computing cluster. Typically, the quality of service provided by the computing cluster is increased by providing some level of redundancy among the power circuits that provide power to the individual electronic devices within the computing cluster.

Although a design specification may indicate that a power distribution system will provide the electronic devices in a computing cluster with completely redundant power circuits, the actual redundancy is subject to human error during installation of the power distribution system and cluster system. Furthermore, the level of redundancy may change dynamically as one or more entities in the power distribution system fail or trip a circuit breaker, or as one or more cables become accidentally disconnected.

BRIEF SUMMARY

One embodiment of the present invention provides a computer-implemented method comprising identifying the path of a first power circuit to a first power supply that is connected to supply power to an electronic device, identifying the path of a second power circuit to a second power supply that is connected to supply power to the same electronic device, comparing the path of the first power circuit with the path of the second power circuit to determine a measure of redundancy in the first and second paths, and providing an output that represents the measure of redundancy to a user.

DETAILED DESCRIPTION

Figure 1:
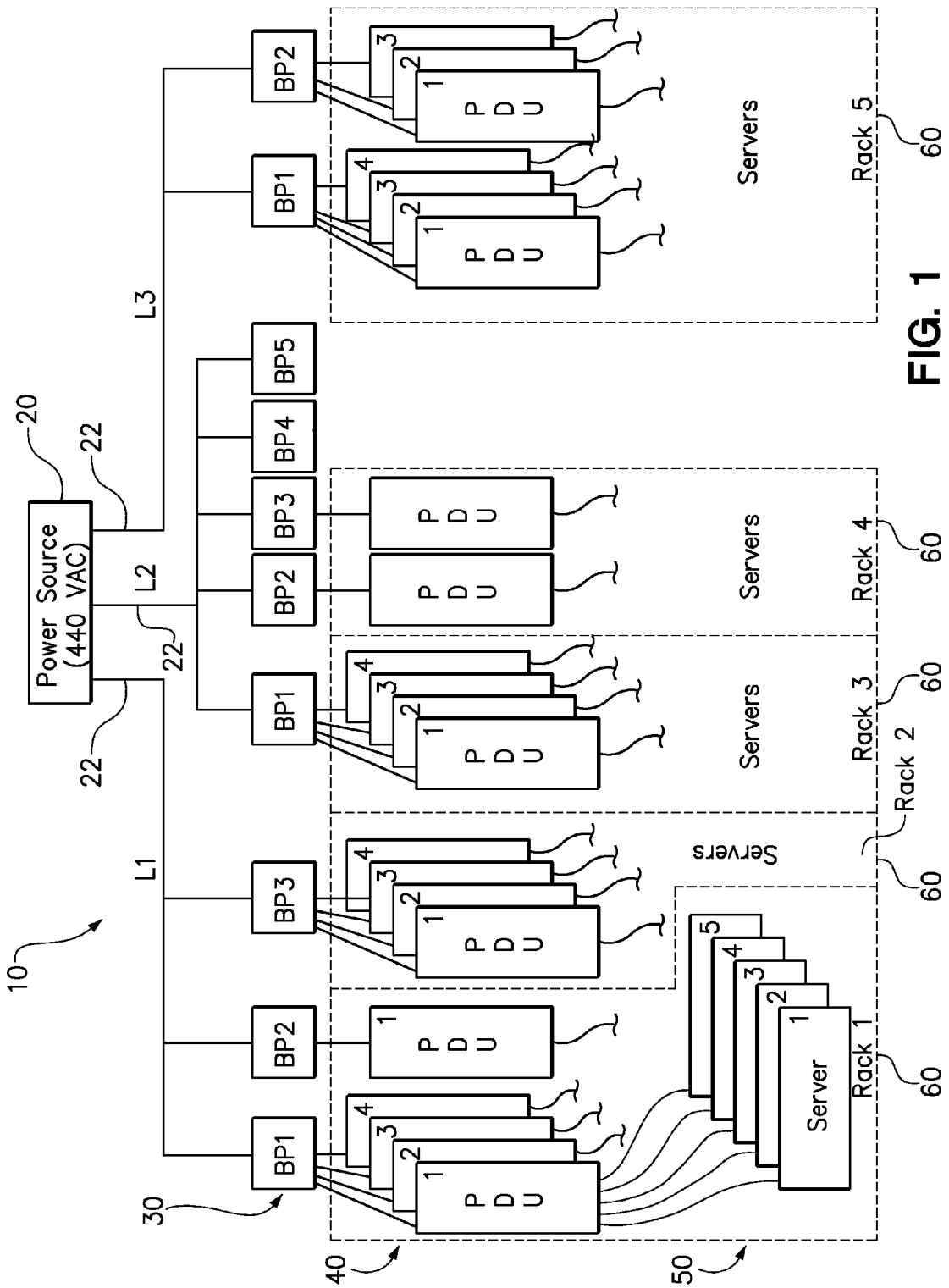
FIG. 1 is a diagram of a power distribution system for a cluster.

One embodiment of the present invention provides a computer-implemented method comprising identifying the path of a first power circuit to a first power supply that is connected to supply power to an electronic device, identifying the path of a second power circuit to a second power supply that is connected to supply power to the electronic device, comparing the path of the first power circuit with the path of the second power circuit to determine a measure of redundancy in the first and second paths, and providing an output that represents the measure of redundancy to a user.

In various embodiments of the invention, the paths of the first and second power circuits are each identified as a series of power entity identification codes. For example, a power circuit may have an incoming phase, a circuit breaker and a power distribution unit supplying electrical power to a power supply of an electronic device. Accordingly, the path of the power circuit to the power supply of the electronic device may be identified by an incoming phase identification code, a circuit breaker identification code, and a power distribution unit identification code. An electronic device, such as a server, having two power supplies can have two power circuits. Therefore, the paths of the first and second power circuits may each be identified by an incoming phase identification code, a circuit breaker identification code, and a power distribution unit identification code.

Embodiments of the invention compare the path of the first power circuit with the path of the second power circuit to determine a measure of redundancy in the first and second paths. If the first and second power circuits have no common entities, then the first and second power circuits are completely independent of each other and are deemed to be fully redundant. A failure of any one entity in either power circuit will not prevent the other power circuit from supplying power to the electronic device. Conversely, if the first and second power circuits have all the same entities, then the first and second power circuits are completely dependent such that there is no redundancy. Without redundancy, failure of any one entity in the power circuit will cause a loss of power to the electronic device. Still further, if the first and second power circuits have some common entities but also some different entities, then the first and second power circuits are partially independent such that there is a limited level of redundancy. Each of these situations may be determined in accordance with one or more embodiment of the present invention.

Embodiments where the paths of the first and second power circuits are each identified as including an incoming phase identification code, the method may further include comparing the incoming phase identification code identified in the path of the first power circuit to the incoming phase identification code identified in the path of the second power circuit to determine whether the first and second power circuits have redundant incoming phases.

Embodiments where the paths of the first and second power circuits are each identified as including a circuit breaker panel identification code, the method may further include comparing the circuit breaker panel identification code identified in the path of the first power circuit to the circuit breaker panel identification code identified in the path of the second power circuit to determine whether the first and second power circuits have redundant circuit breaker panels.

Embodiments where the paths of the first and second power circuits are each identified as including a power distribution unit identification code, the method may further include comparing the power distribution unit identification code identified in the path of the first power circuit to the power distribution unit identification code identified in the path of the second power circuit to determine whether the first and second power circuits have redundant circuit breaker panels.

It should be recognized that embodiment where the paths of the first and second power circuits to the first and second power supplies of the electronic device may each be identified by an incoming phase identification code, a circuit breaker identification code, and a power distribution unit identification code. Accordingly, the invention may include multiple comparisons of the power circuit identification codes. In one specific embodiment, the method may include: comparing the incoming phase identification code identified in the path of the first power circuit to the incoming phase identification code identified in the path of the second power circuit to determine whether the first and second power circuits have redundant incoming phases; comparing the circuit breaker panel identification code identified in the path of the first power circuit to the circuit breaker panel identification code identified in the path of the second power circuit to determine whether the first and second power circuits have redundant circuit breaker panels; and comparing the power distribution unit identification code identified in the path of the first power circuit to the power distribution unit identification code identified in the path of the second power circuit to determine whether the first and second power circuits have redundant circuit breaker panels.

In a further embodiment of the invention, the path of a first power circuit to a first power supply is identified by communicating the incoming phase identification code, the circuit breaker identification code, and the power distribution unit identification code through the power circuit to a management processor of the electronic device. The path of a second power circuit may be similarly identified. Additionally, either or both of the first and second power circuits to a particular power supply may include additional entities, such as more than one level of circuit breaker. However, a power circuit with additional entities may be identified in the same manner as in other embodiments of the invention, except that there will be an additional circuit breaker identification code in the identification of the power circuit.

In a further option, the path of a first power circuit to a first power supply may be identified by communicating identification codes from every entity in the power circuit down to the management processor of the electronic device. For example, the incoming phase identification code may be communicated from an electrical power line management processor over an electrical power supply cable to a circuit breaker panel management processor, the circuit breaker panel identification code and the incoming phase identification code may be communicated from the circuit breaker management processor over an electrical power supply cable to a power distribution unit management processor, and the power distribution unit identification code, the circuit breaker panel identification code and the incoming phase identification code may be communicated from the power distribution unit management processor over an electrical power supply cable to a management processor for the first electronic device. The same process may be used for identifying the path for the second power circuit to the second power supply.

The electrical power supply cables may be of various types. For example, a server power supply cable may have a three socket connector at the server end and a three prong connector at the other end for plugging into a power distribution unit. Other power supply cables may have one or more ends that are stripped of insulation and secured to a terminal. These and other types of electrical power supply cables may be used in accordance with the present invention to supply electrical power from one point to another, such as from a three-phase power source to a circuit breaker panel, from a circuit breaker panel to a power distribution unit, and from a power distribution unit to the power supply of a server, network switch, storage controller or other electronic device that may be used in a cluster environment.

The electrical power supply cable also provides a pathway for digital communication between a management processor in a circuit breaker panel and a management processor in a power distribution unit. This type of digital communication may use the same technology that is used in Ethernet Over Power. However, a more preferred digital communication follows a carrier sense multiple access protocol with collision detection (CSMA/CD). A management processor communicates over the electrical power supply cable using a digital transceiver coupled for communication over the electrical power cable. For example, digital communication between a circuit breaker panel management processor and a power distribution unit management processor may include the circuit breaker panel management processor using a transceiver in communication with each electrical power supply cable providing power to a power distribution unit, and each power distribution unit management processor using a transceiver in communication with the electrical power supply cable providing power to the power distribution unit.

Another embodiment of the invention provides the ability to detect that a power circuit has been broken, such as when a cable becomes disconnected. In one option, the electrical power line management processor, the circuit breaker panel management processor and/or the power distribution unit management processor will periodically send a signal to a management processor of the electronic device to indicate that the first power circuit has not been broken. Such a signal may be referred to as a "keep alive" signal or a "heartbeat" indicating that the entity and the connection are still working. Furthermore, the electronic device may provide an alert signal in response to having not received the signal in greater than a predetermined period of time. Such an alert signal may, for example, enable a warning light on the power supply that is included in the power circuit associated with the alert signal. Alternatively, the alert signal may be a warning displayed on a graphical user interface of the cluster management entity. Still further, the electronic device may store the identified paths of the first and second power circuits, and then, in response to having not received the signal in greater than a predetermined period of time, the electronic device may provide an alert signal that identifies a location of a disabled electrical power supply cable. This is possible because the management processor of the electronic device has the identification codes for its fully functional power circuits and can compare those identification codes with a current set of identification codes from entities in the power circuits that can still communicate with the electronic device. For example, if the management processor of the electronic device can still communicate with a PDU in its first power circuit, but has lost communication with the circuit breaker in that same first power circuit, then either the circuit breaker has failed or the electrical connection between the PDU and the circuit breaker has been broken.

It should be recognized that the communication of identification codes among the entities may be initiated by each entity, perhaps in response to sensing a load through the relevant power circuit, or may be initiated by the electronic device sending a request for identification to each of the management processors that are connected to the power circuit. For example, the electronic device may send a request during startup of the electronic device. It should be appreciated that these communications may occur entirely between the management processors of the entities in the power circuits without involvement of any in-band communication channels. However, it is also possible to involve the cluster management entity to collect the identification codes associated with each power circuit and/or each of the identified electrical connections.

The measure of redundancy may, for example, identify whether or not the power circuit includes redundant incoming phases, redundant circuit breakers, redundant power distribution units, or a combination thereof. Any such measure of redundancy may be communicated to a cluster management entity. One measure of redundancy may characterize any number of redundancy levels. In one example, a level "0" redundancy indicates no redundancy, a level "1" redundancy indicates partial redundancy, and a level "2" redundancy indicates full redundancy.

Although embodiments of the invention have been described with respect to a computing cluster, it should be recognized that the power circuit identification and redundancy determinations of the present invention may be implemented on any type or size of computer system, including data centers and cloud computing systems.

Embodiments of the present invention recognize that an electrical power supply cable connection may be used as the communication transmission medium and that an individual connection can be described by its endpoints. Each endpoint is provided with a management processor and each endpoint is assigned an identification code. Digital communication between the management processors at the two endpoints of an electrical power supply cable connection enables those two management processors to form an association between their identification codes. These digital communications can occur between the two management processors at the endpoints of every electrical power supply cable connection in the power distribution system. When some or all of the management processors report the pair of identification codes associated with each electrical power supply cable connection to a common entity, such as a cluster management entity, that entity has a full description of the power distribution system. It is important to recognize that this provides a full description of the power distribution system as actually installed, whether or not the power cables were connected according to a design specification. According to various embodiments of the invention, the management processors in a given power circuit report their identification codes to a server or other electronic device to which the power circuit is connected to supply electrical power. In this manner, each electronic device receives the identification codes that are associated with the power circuit entities through which it receives power.

In a further embodiment, the method further includes the power distribution unit detecting its position in the computer system rack and including the detected rack position as part of the power distribution unit identification code. Optionally, the rack position of other devices is identified by each of those other devices detecting a rack position and communicating the detected rack position to a central management entity. In one embodiment, a computer system rack includes a plurality of power distribution units and a plurality of servers that each detects their position in the rack. The relative rack positions may then be used to determine which server is coupled to receive electrical power from which power distribution unit. Still further, the rack positions may be used simply to direct a user where to find a disabled device or disconnected electrical power supply cable.

It should be recognized that the communications between any two management processors, as well as the communications between any one of the management processors and the cluster management entity, may be implemented in a computer program product that provides a processor with computer usable program code for implementing one or more steps of the methods described herein. Many other aspects of the methods of the present invention may also be implemented with computer usable program code.

FIG. 1 is a diagram of a basic power distribution system 10 for a cluster that includes a plurality of servers 50. The main electrical power source 20 comes into a building as a three-phase voltage at 440 VAC. These three phases are then broken down into three single-phase 120 VAC lines 22. The three power lines 22 are labeled as L1, L2 and L3.

Each electrical power line 22 is connected to one or more circuit breaker panels, which are labeled as BP# (Breaker Panel number). While FIG. 1 numbers the circuit breaker panels 30 for each power line 22 starting from "1", each circuit breaker panel 30 may be unique and will preferably have its own circuit breaker panel identification code to distinguish it from the other circuit breaker panels. It should also be recognized that the power distribution system 10 might also have "layered" circuit breaker panels, where a first circuit breaker panel has an electrical supply output that is connected to the input to a second circuit breaker panel. However, management processors in the first and second circuit breaker panels may still communicate their identification codes to identify the electrical connection between the two circuit breaker panels, and communicate the endpoints of the electrical connection to the cluster management entity. This communication may occur in the same manner described herein for a communication between a circuit breaker panel management processor and a power distribution unit management processor.

Each circuit breaker panel 30 may be connected to a power distribution unit (PDU) 40 in order to provide electrical power to each power distribution unit 40. As with the circuit breaker panels, FIG. 1 numbers the power distribution units 40 connected to each circuit breaker panel 30 starting from "1". However, each power distribution unit 40 will preferably have its own power distribution unit identification code to distinguish it from the other power distribution units. It should also be recognized that the power distribution system 10 might also have "layered" power distribution units, where a first power distribution unit has an electrical supply output that is connected to the input to a second power distribution unit. However, management processors in the first and second power distribution units may still communicate their identification codes to identify the electrical connection between the two power distribution units, and communicate the endpoints of the electrical connection to the cluster management entity. This communication may occur in the same manner described herein for a communication between a circuit breaker panel management processor and a power distribution unit management processor.

The servers 50, as well as other electronic devices, are connected to the power distribution units 40 to receive electrical power. The servers 50 and other electronic devices may be arranged into racks 60 and place a load on the power distribution units 40. As shown, the power distribution units 40 are also disposed with the racks 60.

Figure 2:
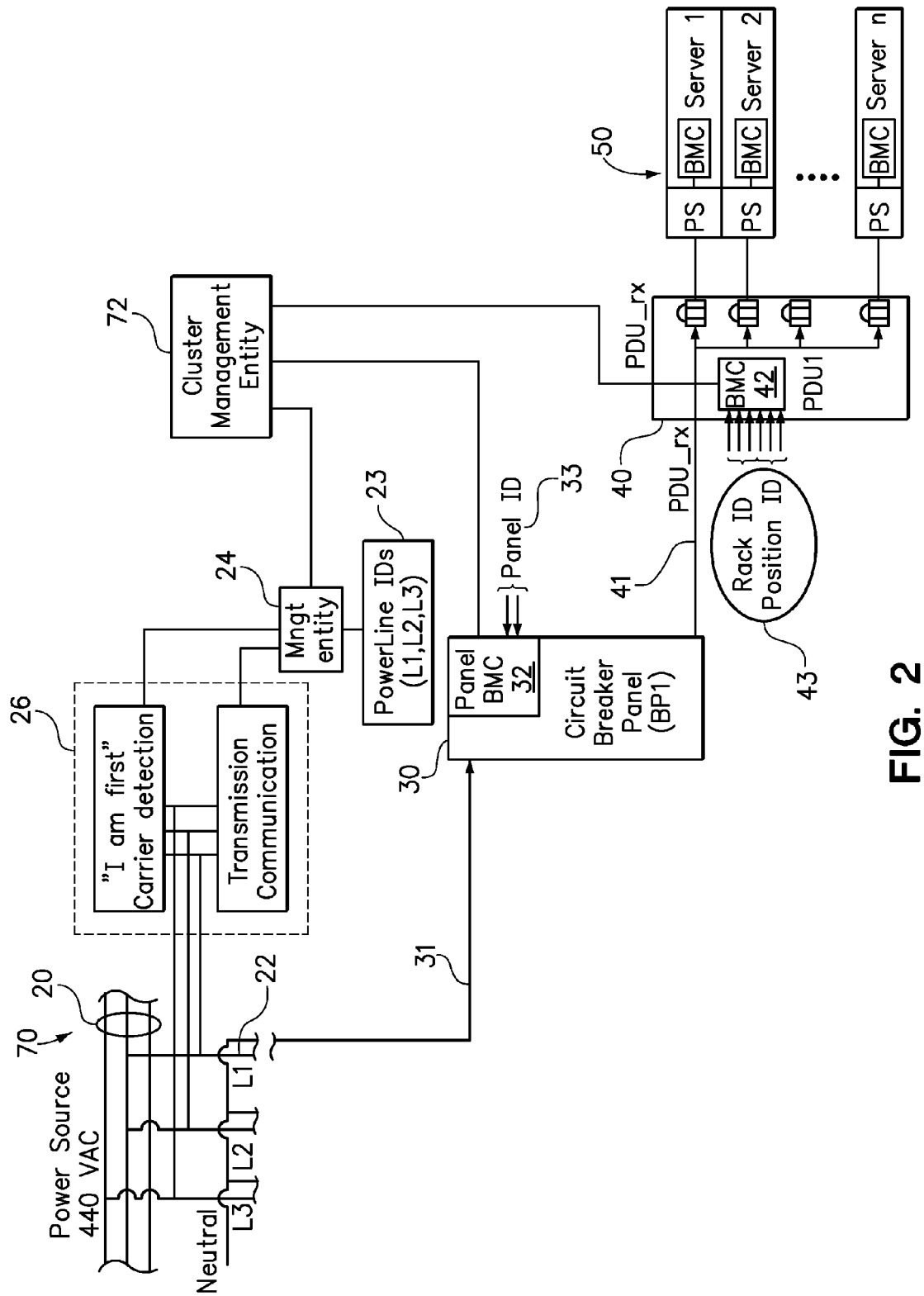
FIG. 2 is a diagram of a power circuit within the power distribution system.

FIG. 2 is a diagram of a power circuit 70 within the power distribution system 10 of FIG. 1. The power circuit 70 encompasses the supply of electrical power from the three-phase power source 20, through the L1 single-phase power line 22, through the circuit breaker panel 30, and through the power distribution unit 40 to one or more servers 50 (Servers 1 through n). Accordingly, this power circuit 70 is representative of any one branch of the power distribution system 10.

In accordance with one embodiment of the present invention, the three single-phase power lines 22 are associated with a management processor 24, the circuit breaker panel 30 includes a management processor (baseboard management controller, BMC) 32, and the power distribution unit 40 includes a management processor (baseboard management controller, BMC) 42. Optionally, these management processors 24, 32, 42 may each be in communication with a cluster management entity 72. The management processors could be dedicated solely to the performance of the present invention, but may be capable of further functions.

The electrical power line management processor 24 is able to communicate with the circuit breaker panel management processor 32 via the electrical supply cable 31 forming an electrical connection there between. Similarly, the circuit breaker panel management processor 32 is able to communicate with the power distribution unit management processor 42 via the electrical power supply cable 41. In each instance, the management processor is able to transmit and/or receive signals by coupling the transmission signal to the AC line or cable. The management processor may communicate with a detection and transmission entity for this purpose. For example, the electrical power line management processor 24 is shown coupled to a detection and transmission entity 26. A similar detection and transmission entity may be included in the circuit breaker panel and the power distribution unit, but are not shown in FIG. 2. A more detailed description of the detection and transmission entity 26 is provided in reference to FIGS. 5-8.

Furthermore, the electrical power line management processor 24 is able to access electrical power line identification codes for each of the electrical power lines 22 (L1, L2, L3), the circuit breaker panel management processor 32 is able to access a circuit breaker panel identification code, and the power distribution unit management processor 42 is able to access a power distribution unit identification code. Each of the identification codes are preferably unique and may be arbitrary or systematic. In one example, the electrical power line identification codes 23 may be arbitrarily assigned and stored in media accessible to the electrical power line management processor 24, while the circuit breaker panel identification code 33 may be detected by the circuit breaker panel management processor 32 and the power distribution unit management processor 42 is able to detect a power distribution unit identification code 43. As described in relation to FIGS. 3 and 4, the circuit breaker panel identification code 33 may be dependent upon the position of the circuit breaker panel 30 in a circuit breaker box (not shown) and the power distribution unit identification code 43 may be dependent upon the position of the power distribution unit 40 in a rack. However, any of the identification codes may be merely assigned.

Figure 3:
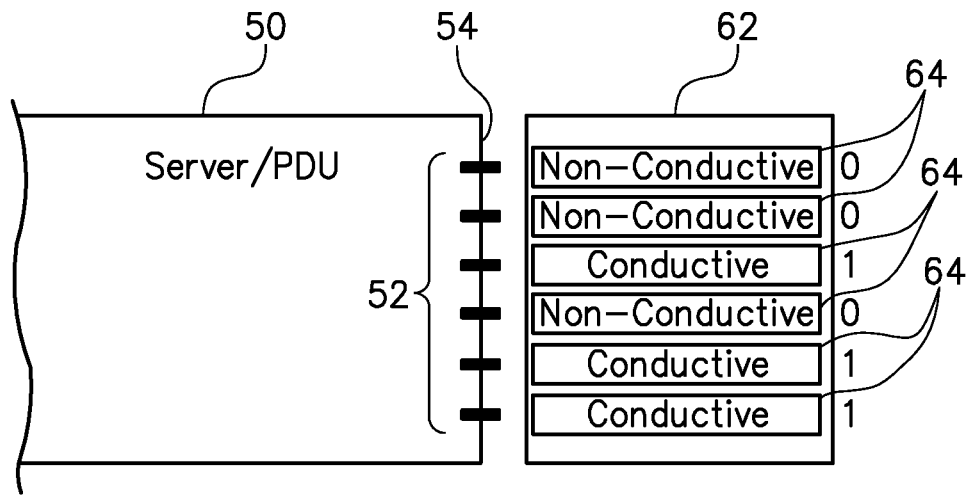
FIG. 3 is a diagram of a server aligned for contact with an address plate in a given position within a rack.

FIG. 3 is a diagram of a device 50, such as a server or PDU, aligned for contact with an address plate 62 in a given position within a rack. Each device 50 can determine its own position within the rack and communicate that position to a central management entity, such as an Extreme Cloud Administrative Toolkit (xCAT) management entity (available from International Business Machines Corporation of Armonk, N.Y.). Rack positions may be selected from a known number and arrangement of bays within the rack, such as following a standard configuration of "1U" bays. For example, a server 50 can detect its own position using a plurality of spring-loaded electrical pickups 52 formed along a back surface 54 of the server and aligned for contact with an equal plurality of contacts 64 on an address plate securing within the rack. As shown, there are six pickups 52 aligned with six contacts 64. The contacts 64 on each address plate 62 are either conductive or non-conductive and are arranged to provide a unique binary code representing a known location in the rack. Optionally, a non-conductive contact may represent a "0" and a conductive contact may represent a "1". When the contacts 64 are arranged for contact with the spring-loaded electrical pickups 52, the server 50 is able to read the address that represents its location within the rack. For example, the address shown is binary "0 0 1 0 1 1 b "(binary notation) which equates to position 11 within the rack. A PDU may similarly detect its own position. Based upon a consistent practice of connecting a server 50 to a power distribution unit 40 based upon their relative positions within a rack, such as making power connections directly laterally, the relative positions can be considered to be determinative of which servers are connected to which PDUs.

Figure 4:
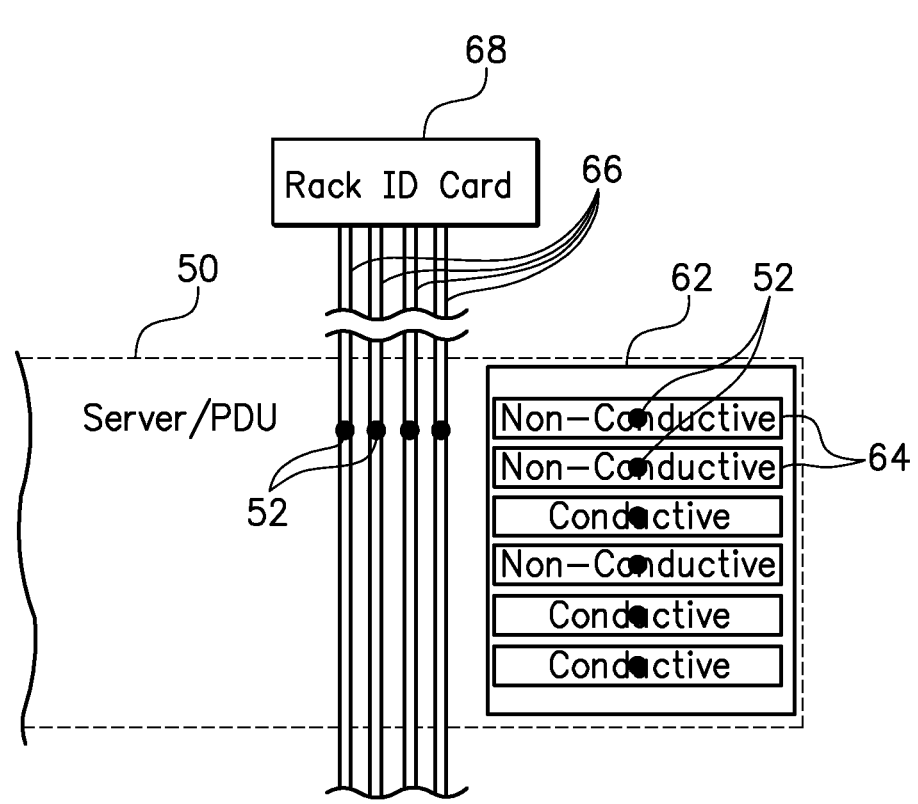
FIG. 4 is a diagram of a server aligned in contact with rack identification wires and the address plate.

FIG. 4 is a diagram of a device 50, such as a server or a PDU, aligned in contact with rack identification wires 66 and the address plate 62. Accordingly, each device may detect a rack identification code or address for the rack in which the device is positioned. For example, a rack identification card 68 may be added to the rack and may include a battery and electrical wires 66 that run down a vertical frame of the rack. The rack identification card 68 includes a unique rack address that is placed onto the wires 66 that run from the card connection down the rack frame. As described above for position detecting within a rack, the installed server or PDU may include electrical pickups 52 that are aligned for contact with the wires 66 along the vertical frame. For example, a plurality of wires may be selectively coupled to a battery or ground in order to comprise a binary rack identification number. One illustration of the location of a device 50 may be represented as Rack#-U#, which is a concatenation of the rack identification (Rack #) and the U position (U#) of the device.

Figure 5:
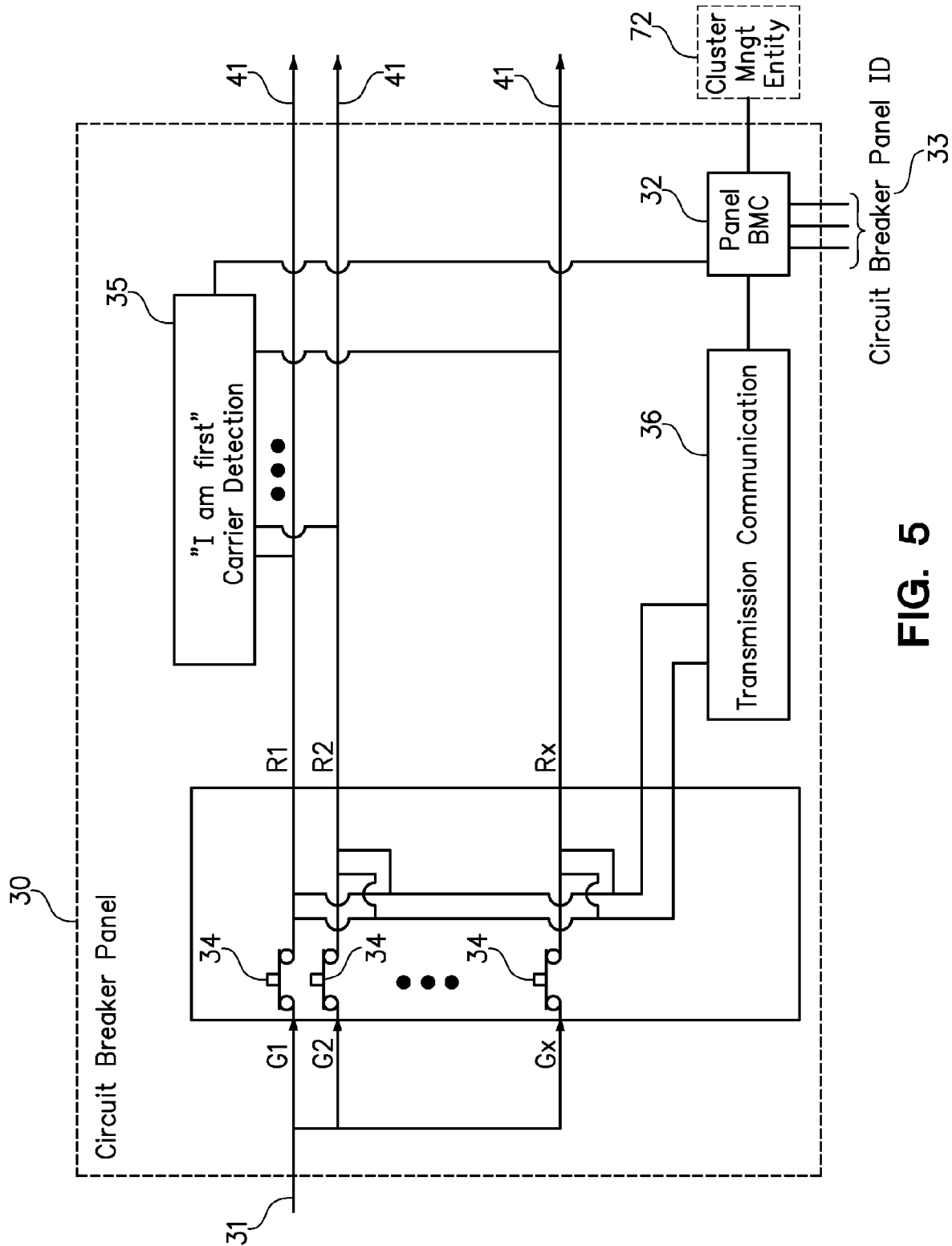
FIG. 5 is a diagram of a circuit breaker panel.

FIG. 5 is a diagram of a circuit breaker panel 30. A power supply line 31 from a higher level circuit, such as the 440 VAC line 1 (L1), branches into inputs G1 through Gx. R1 through Rx are the outputs 41 after the circuit breakers 34. Accordingly, G1 goes to R1, G2 goes to R2, and Gx goes to Rx. R1, R2 and R3 lead to downstream PDUs 40.

The circuit breaker panel 30 has a panel BMC 32 which detects its circuit breaker panel identification code 33 and can communicate with the cluster management entity 72. The panel BMC 32 is also associated with a carrier detection circuit 35 and a transmission communication device 36. The operation of the carrier detection circuit 35 is described in greater detail in relation to FIGS. 7 and 8. However, the carrier detection circuit 35 has a set of leads in contact with the output lines R1-Rx. When the carrier detection circuit 35 detects a carrier signal on one of these signal lines, the circuit 35 can inform the panel BMC 32 which electrical power supply cable had the first signal. The transmission communication device 36 will then receive the communication. Together, the carrier detection circuit 35 and the transmission communication device 36 enable the panel BMC 32 to receive communications from various sources, yet identify where the communication came from. The operation of the carrier detection circuit 35 also prevents corruption of a communication due to multiple simultaneous communications.

Figure 6:
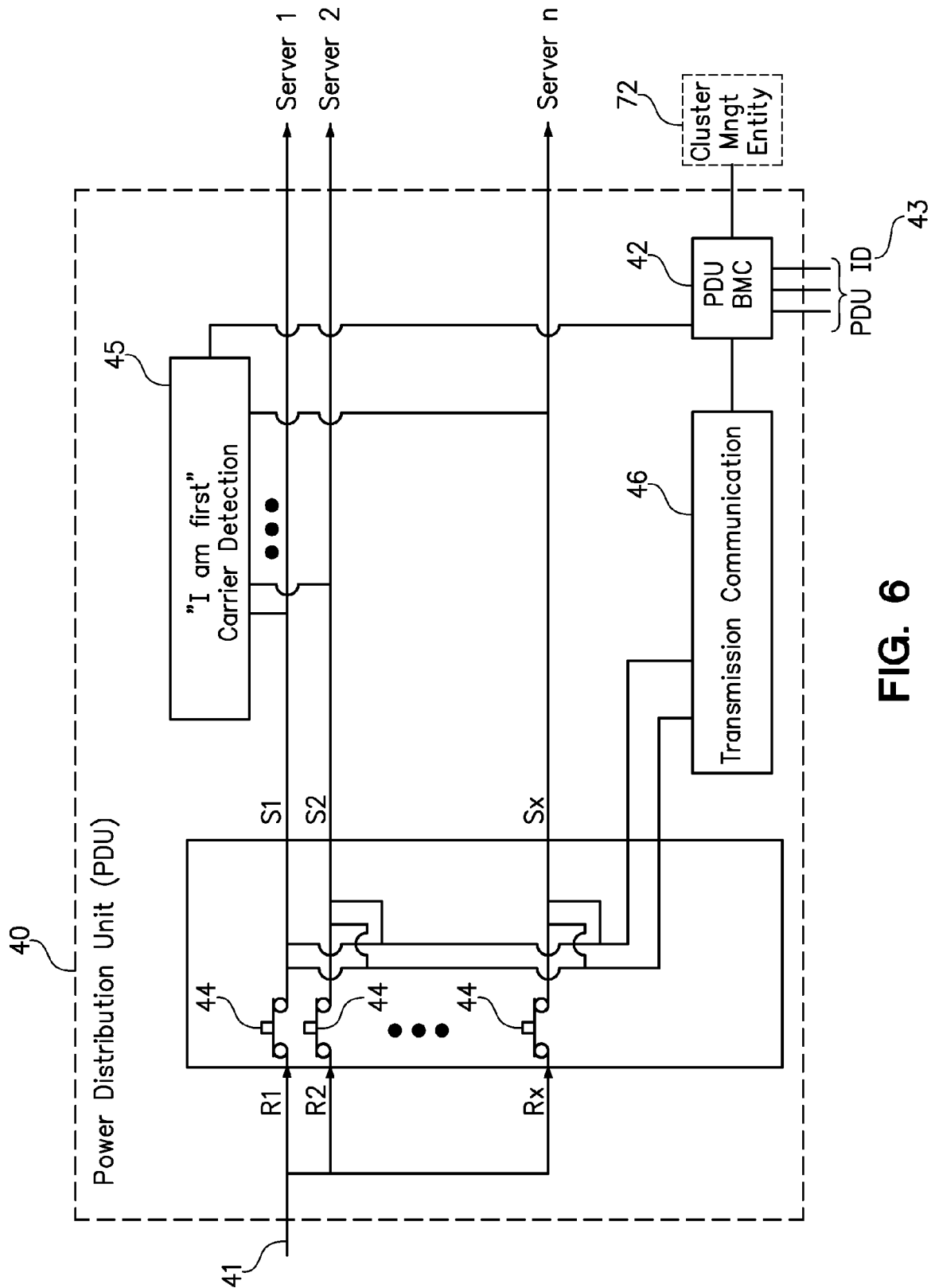
FIG. 6 is a diagram of a power distribution unit.

FIG. 6 is a diagram of a power distribution unit 40. R1 through Rx are inputs 41 from the higher level circuit, such as the output from the circuit breaker panel. S1 through Sx are the outputs from the power distribution unit 40 to the servers (Server 1 through Server n).

The power distribution unit 40 has a PDU BMC 42 which detects its power distribution unit identification code (PDU ID) 43 and can communicate with the cluster management entity 72. The PDU BMC 42 is also associated with a carrier detection circuit 45 and a transmission communication device 46. The operation of the carrier detection circuit 45 is described in greater detail in relation to FIGS. 7 and 8. However, the carrier detection circuit 45 has a first set of leads in contact the output lines S1-Sx. When the carrier detection circuit 45 detects a carrier signal on one of these signal lines, the circuit 45 can inform the PDU BMC 42 which electrical power supply cable had the first signal. The transmission communication device 46 will then receive the communication. Together, the carrier detection circuit 45 and the transmission communication device 46 enable the PDU BMC 42 to receive communications from various sources, yet identify where the communication came from. The operation of the carrier detection circuit 45 also prevents corruption of a communication. Once communication is established between one entity (i.e., a server 50 in FIG. 2) on the Sx output lines and the PDU BMC 42, the PDU BMC 42 is able to obtain the unique ID of the entity attached to that specific line. As entities are added to each Sx output line, the PDU BMC 42 is able to tabulate which entity 50 is associated with which Sx output line.

Figure 7:
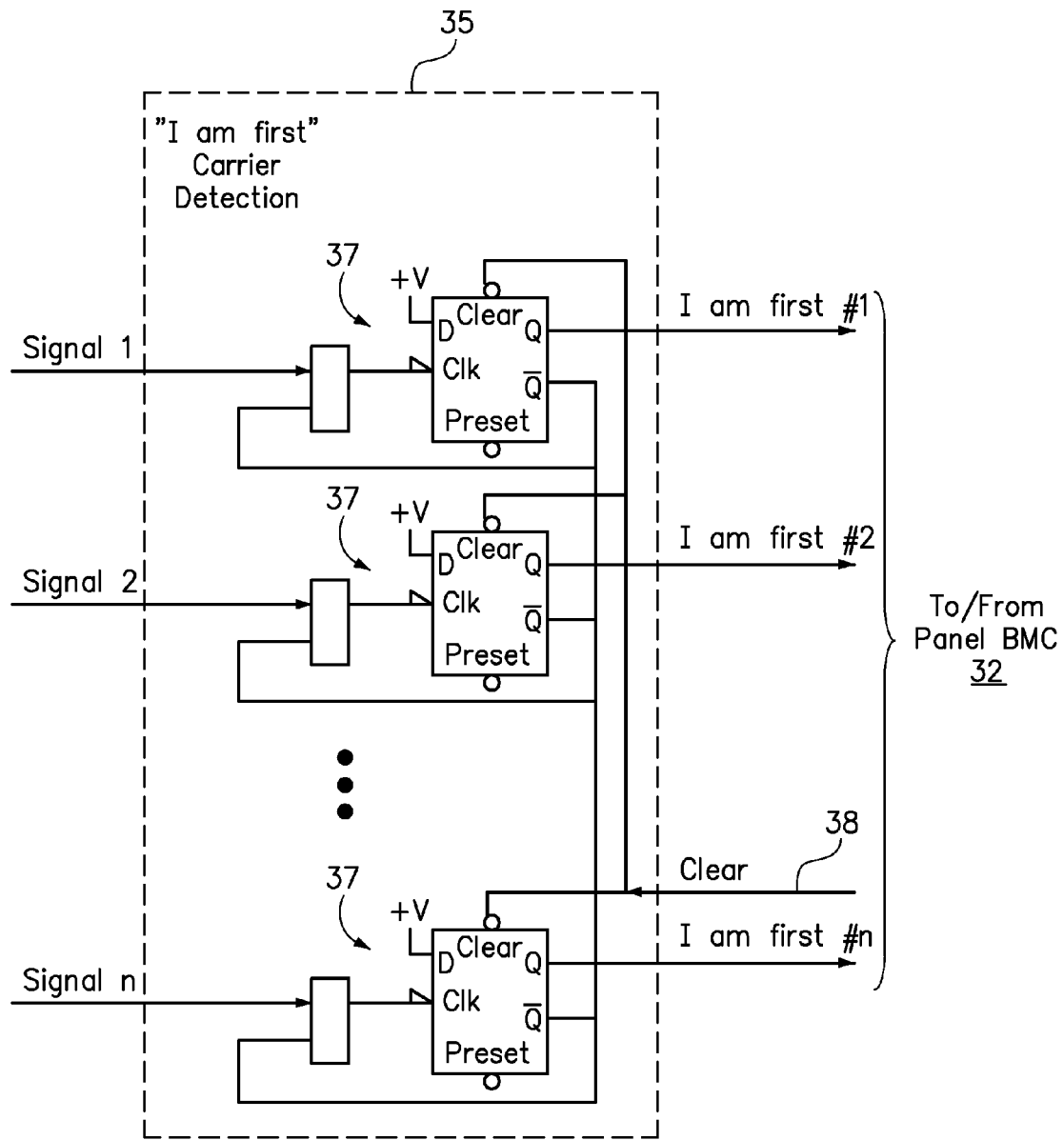
FIG. 7 is a diagram of a carrier detection circuit.

FIG. 7 is a diagram of the carrier detection circuit 35 having three leads for detecting a carrier signal on any of three electrical power supply cables 31. Signal n is an Ethernet-type transmission signal from either the electrical power line management processor 24 or the power distribution unit management processor 42. For example, Signal 1 in FIG. 7 may come from line (R1) 41 in FIG. 5. The carrier detection circuit 35 includes an edge-triggered latch 37 in each signal line. When a carrier signal is detected, the latch "Q" output goes to a logical "1" level, and the Q-not goes to a logical "0" and disables the remainder of the circuit. However, the latch must be reset in order for another entity to transmit a signal. So, the management processor 32 in the circuit breaker 30 will reset the latch with the "Clear from Detection Circuit" signal 38. Using an Ethernet-type protocol, each entity (such as an electrical power line management processor, power distribution unit management processor, or baseboard management controller) waits a different random amount of time and then transmits a signal in the same manner to identify itself. The carrier detection circuit 45 in the power distribution unit 40 works in the same manner.

Referring back to FIG. 5, the circuit breaker panel 30 uses the carrier detection circuit 35 to identify the PDU that is connected to each output 41 from the circuit breaker panel. Note that the electrical power supply lines or cables are similar to the bus structure of an Ethernet network in which each originator is attached to the same physical bus. However, the circuit breaker of the present invention takes advantage of the delay between the time the first entity receives the signal and the time it is transmitted to the other bus connections within the circuit breaker box. First, the originator of the message transmits a message and monitors his own message to ensure it is not corrupted by someone else on the bus. For example, the PDU BMC 42 may transmit a communication using the carrier sense multiple access with collision detection (CSMA/CD) scheme similar to the Ethernet protocol. If the communication is corrupted, the PDU BMC (the "originator" in this example) waits a random amount of time and then retries the transmission of the communication. Assuming two or more entities do not transmit on the power circuit at the same time, the circuit breaker panel management processor 32 can then identify and communicate with each PDU BMC to identify which entity is on which power circuit and also obtain power status for that entity.

Figure 8:
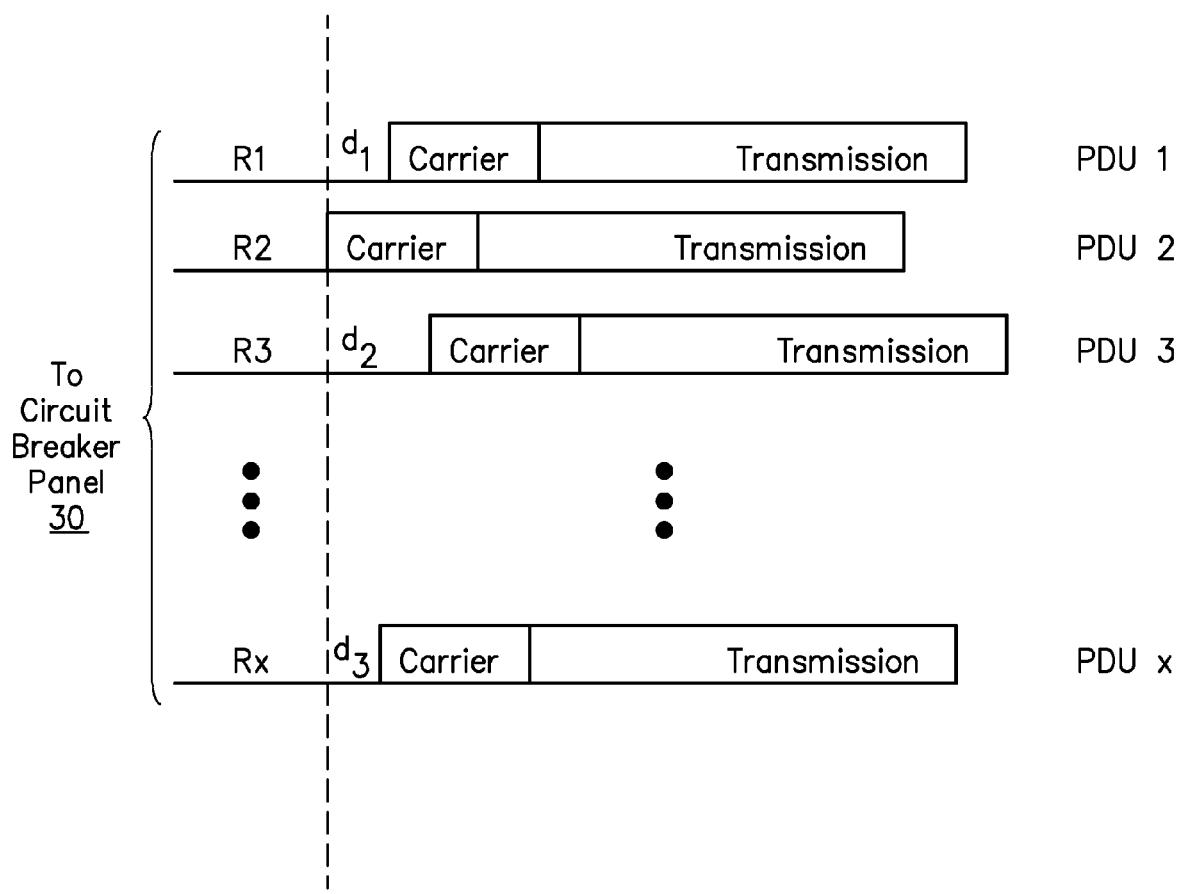
FIG. 8 is a timing diagram illustrating four attempted communications from a power distribution unit to a circuit breaker panel.

FIG. 8 is a timing diagram illustrating four attempted communications from four power distribution units 40 to a circuit breaker panel 30. In the timing diagram, PDU 2 is detected first because there is a delay of d1 in the carrier signal from PDU 1, a delay of d2 in the carrier signal from PDU 3, and a delay of d3 in the carrier signal from PDU X. Once this occurs, the transmission between the circuit breaker panel management processor and the PDU 2 management processor occurs. Once the transmission is complete, the circuit breaker panel management processor resets the "I am first" circuitry (using the clear signal 38 in FIG. 7) and waits for the next PDU to identify itself. The PDU BMC preferably identifies itself with a Rack#/PDU# identification code, which is used to give the cluster management entity a clear picture of the electrical connections in the cluster. Note that the same diagram is used for each power identification level, including the PDU, circuit breaker, and 440 VAC input. Although this example describes a communication from a PDU to a circuit breaker panel, the same process is used to support communication between any two management processors in the power circuit in accordance with the invention.

Figure 9:
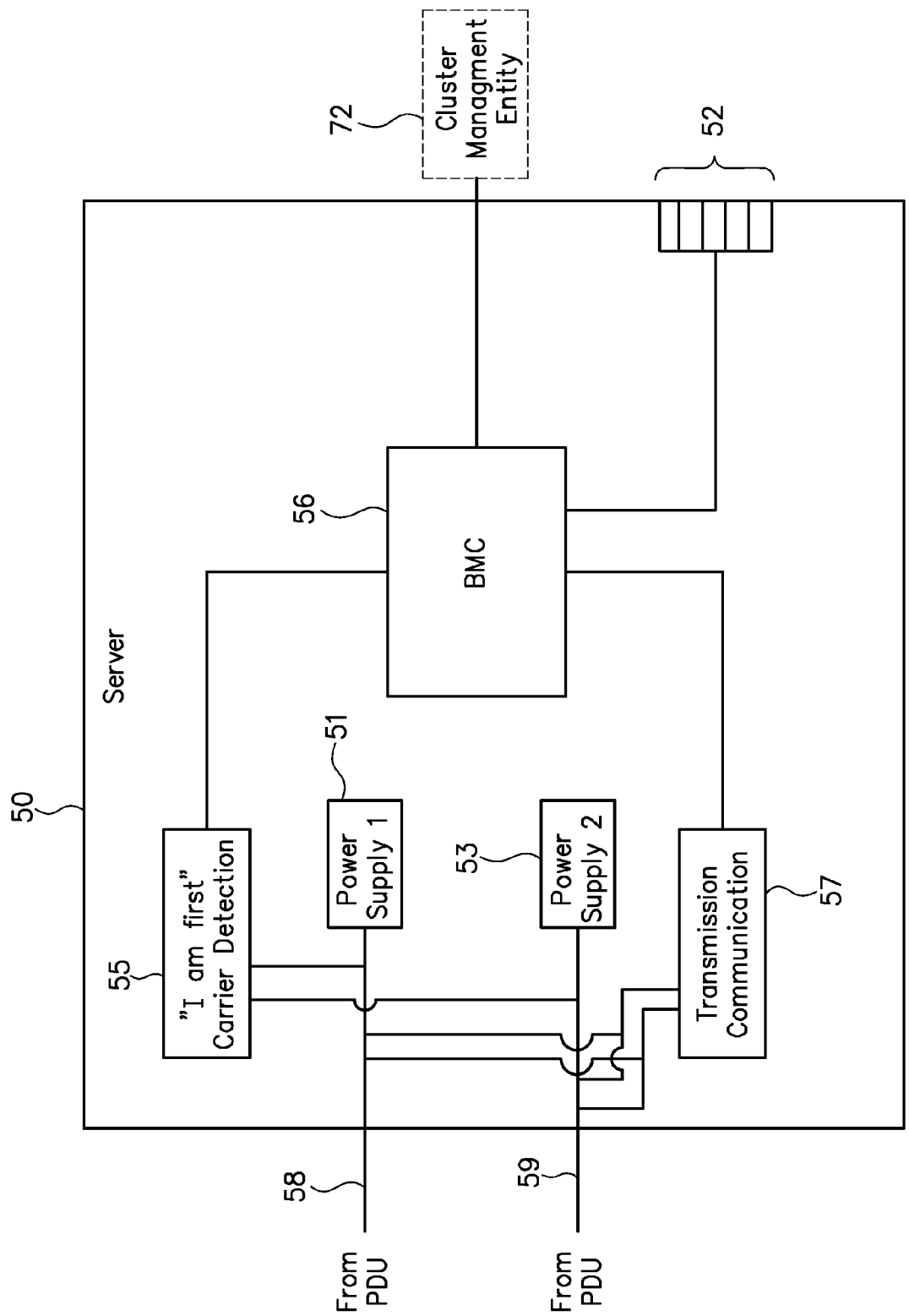
FIG. 9 is a diagram of a server receiving power from the power distribution system.

FIG. 9 is a diagram of a server 50 receiving power from a power distribution system. More specification, a first power supply 51 is connected to receive power from a PDU over a first power supply cable 58 and a second power supply 53 is separately connected to receive power from a PDU over a second power supply cable 59. The carrier detection circuit 55 and the transmission communication device 57 function in the same manner as described in relation to the previous Figures. The server 50 has a BMC 56 which detects its server identification code 52 and can communicate with the cluster management entity 72. The BMC 56 receives identification codes for the first and second power circuits that provide power to the first and second power supplies 51, 53.

Figure 10:
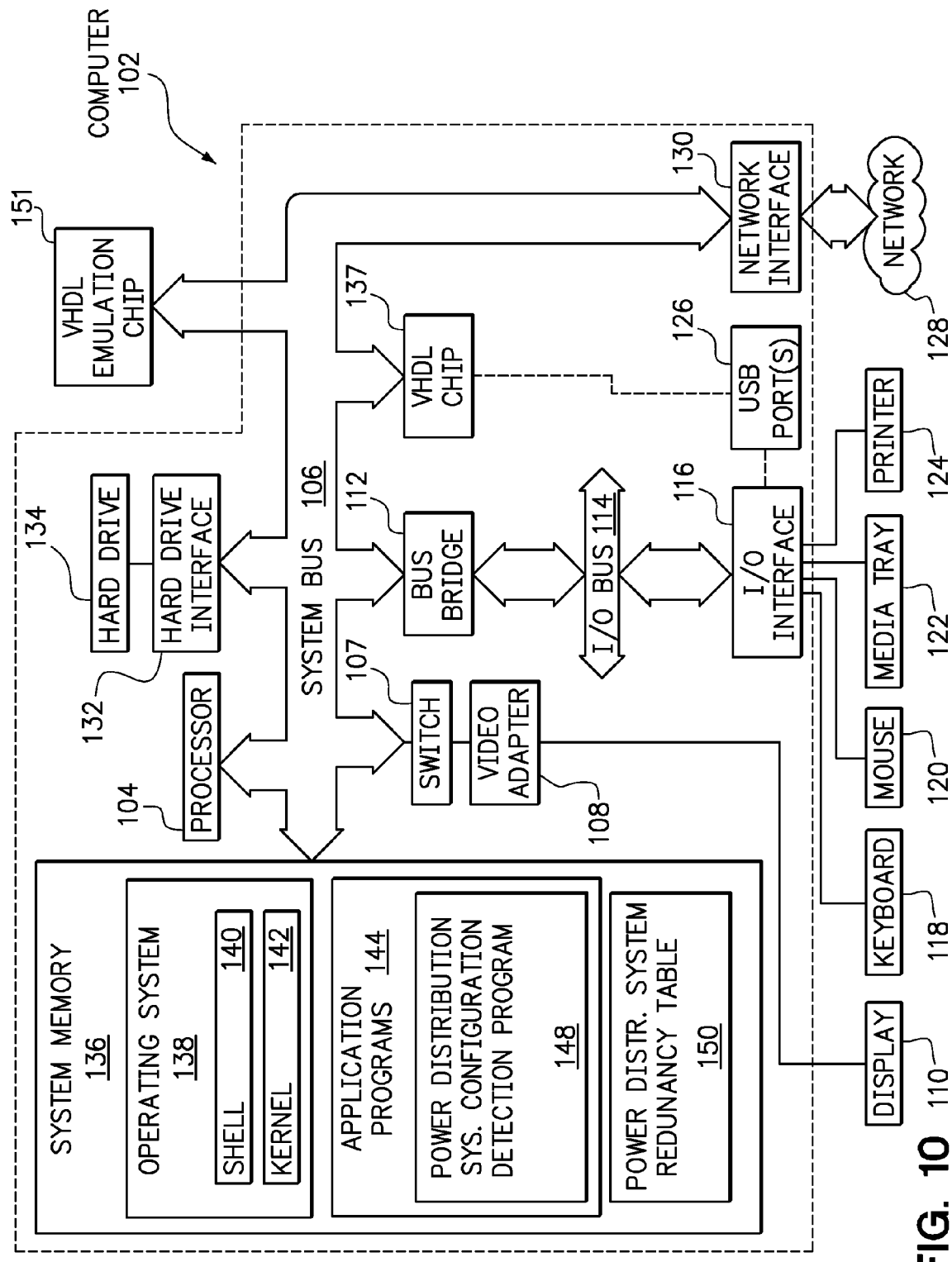
FIG. 10 is a diagram of a computer capable of serving as a cluster management entity.

FIG. 10 is a diagram of a computer capable of serving as a cluster management entity in accordance with one or more optional embodiments. Note that some or all of the exemplary architecture, including both depicted hardware and software, shown for and within the computer 100 may be implemented in the cluster management entity 72 shown in FIG. 2.

Computer 100 includes a processor unit 104 that is coupled to a system bus 106. Processor unit 104 may utilize one or more processors, each of which has one or more processor cores. A video adapter 108, which drives/supports a display 110, is also coupled to system bus 106. In one embodiment, a switch 107 couples the video adapter 108 to the system bus 106. Alternatively, the switch 107 may couple the video adapter 108 to the display 110. In either embodiment, the switch 107 is a switch, preferably mechanical, that allows the display 110 to be coupled to the system bus 106, and thus to be functional only upon execution of instructions that support the processes described herein.

System bus 106 is coupled via a bus bridge 112 to an input/output (I/O) bus 114. An I/O interface 116 is coupled to I/O bus 114. I/O interface 116 affords communication with various I/O devices, including a keyboard 118, a mouse 120, a media tray 122 (which may include storage devices such as CD-ROM drives, multi-media interfaces, etc.), a printer 124, and (if a VHDL chip 137 is not utilized in a manner described below), external USB port(s) 126. While the format of the ports connected to I/O interface 116 may be any known to those skilled in the art of computer architecture, in a preferred embodiment some or all of these ports are universal serial bus (USB) ports.

As depicted, the computer 100 is able to communicate over a network 128 using a network interface 130. Network 128 may be an external network such as the Internet, or an internal network such as an Ethernet or a virtual private network (VPN).

A hard drive interface 132 is also coupled to system bus 106. Hard drive interface 132 interfaces with a hard drive 134. In a preferred embodiment, hard drive 134 populates a system memory 136, which is also coupled to system bus 106. System memory is defined as a lowest level of volatile memory in computer 100. This volatile memory includes additional higher levels of volatile memory (not shown), including, but not limited to, cache memory, registers and buffers. Data that populates system memory 136 includes the computer's operating system (OS) 138 and application programs 144.

The operating system 138 includes a shell 140, for providing transparent user access to resources such as application programs 144. Generally, shell 140 is a program that provides an interpreter and an interface between the user and the operating system. More specifically, shell 140 executes commands that are entered into a command line user interface or from a file. Thus, shell 140, also called a command processor, is generally the highest level of the operating system software hierarchy and serves as a command interpreter. The shell provides a system prompt, interprets commands entered by keyboard, mouse, or other user input media, and sends the interpreted command(s) to the appropriate lower levels of the operating system (e.g., a kernel 142) for processing. Note that while shell 140 is a text-based, line-oriented user interface, the present invention will equally well support other user interface modes, such as graphical, voice, gestural, etc.

As depicted, OS 138 also includes kernel 142, which includes lower levels of functionality for OS 138, including providing essential services required by other parts of OS 138 and application programs 144, including memory management, process and task management, disk management, and mouse and keyboard management. Application programs 144 in the system memory of computer 100 may include a power distribution system configuration detection program 148. The system memory 136 may also store a power distribution system configuration and redundancy table 150 for use in the methods described herein.

The system memory 136 may also include a VHDL (VHSIC hardware description language) program. VHDL is an exemplary design-entry language for field programmable gate arrays (FPGAs), application specific integrated circuits (ASICs), and other similar electronic devices. In one embodiment, execution of instructions from a VMPP causes a VHDL program to configure the VHDL chip 137, which may be an FPGA, ASIC, or the like.

In another embodiment of the present invention, execution of instructions from VMPP results in a utilization of VHDL program to program a VHDL emulation chip 151. VHDL emulation chip 151 may incorporate a similar architecture as described above for VHDL chip 137. Once VMPP and VHDL program the VHDL emulation chip 151, VHDL emulation chip 151 performs, as hardware, some or all functions described by one or more executions of some or all of the instructions found in VMPP. That is, the VHDL emulation chip 151 is a hardware emulation of some or all of the software instructions found in VMPP. In one embodiment, VHDL emulation chip 151 is a programmable read only memory (PROM) that, once burned in accordance with instructions from VMPP and VHDL program, is permanently transformed into a new circuitry that performs the functions needed to perform the processes of the present invention.

The hardware elements depicted in computer 100 are not intended to be exhaustive, but rather are representative devices suitable to perform the processes of the present invention. For instance, computer 100 may include alternate memory storage devices such as magnetic cassettes, digital versatile disks (DVDs), Bernoulli cartridges, and the like. These and other variations are intended to be within the spirit and scope of the present invention.

Figure 11:
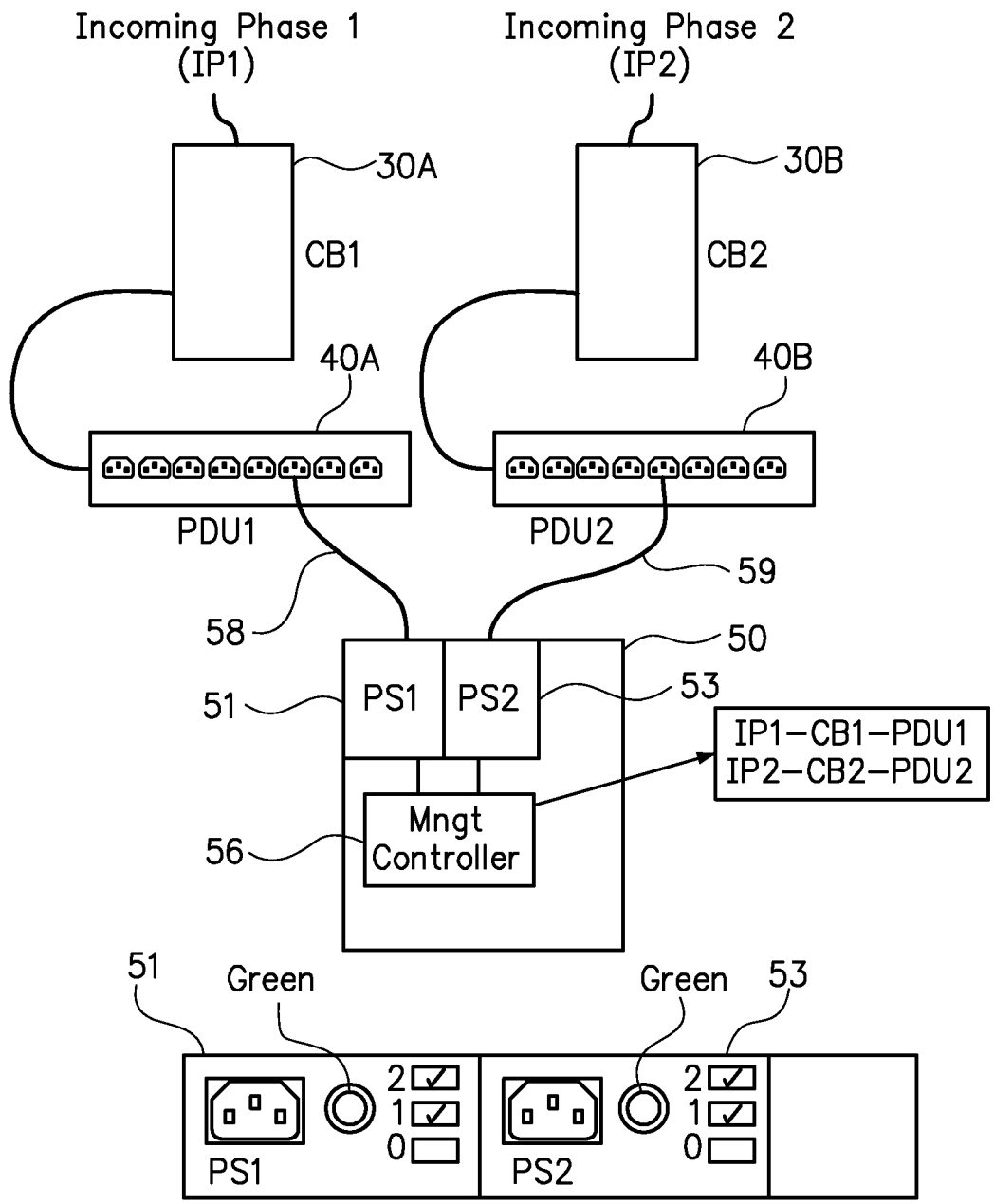
FIG. 11 is a diagram of a basic power distribution system with dual phase, dual PDU redundancy.

FIG. 11 is a diagram of a basic power distribution system with dual phase, dual PDU redundancy. A first power supply (PS1) receives power through a first power circuit that includes a first incoming phase (IP1), a first circuit breaker (CB1), and a first power distribution unit (PDU1). In accordance with embodiments of the invention described above, the management processor 56 for the electronic device 50, such as the baseboard management controller for a server, obtains the identification codes for the entities in the first power circuit and stores the identified first power circuit as IP1-CB1-PDU1. Similarly, a second power supply (PS2) receives power through a second power circuit that includes a second incoming phase (IP2), a second circuit breaker (CB2), and a second power distribution unit (PDU2). In accordance with embodiments of the invention described above, the management processor 56 for the electronic device 50, such as the baseboard management controller for a server, obtains the identification codes for the entities in the second power circuit and stores the identified second power circuit as IP2-CB2-PDU2. A comparison of the first power circuit (IP1-CB1-PDU1) and the second power circuit (IP2-CB2-PDU2) shows that the two power circuits use different incoming phases, different circuit breaker panels, and different power distribution units to supply power to the two separate power supplies. Accordingly, the first and second power circuits are determined to be entirely redundant. As a result, a set of light emitting diodes (LEDs) on an exposed surface of the two power supplies are energized to produce a visual indication that the power circuits providing power to those power supplies is entirely redundant. Using a measure of redundancy as level 0, level 1, or level 2, the LEDs are energized to indicate a level 2 (highest) level of redundancy.

Figure 12:
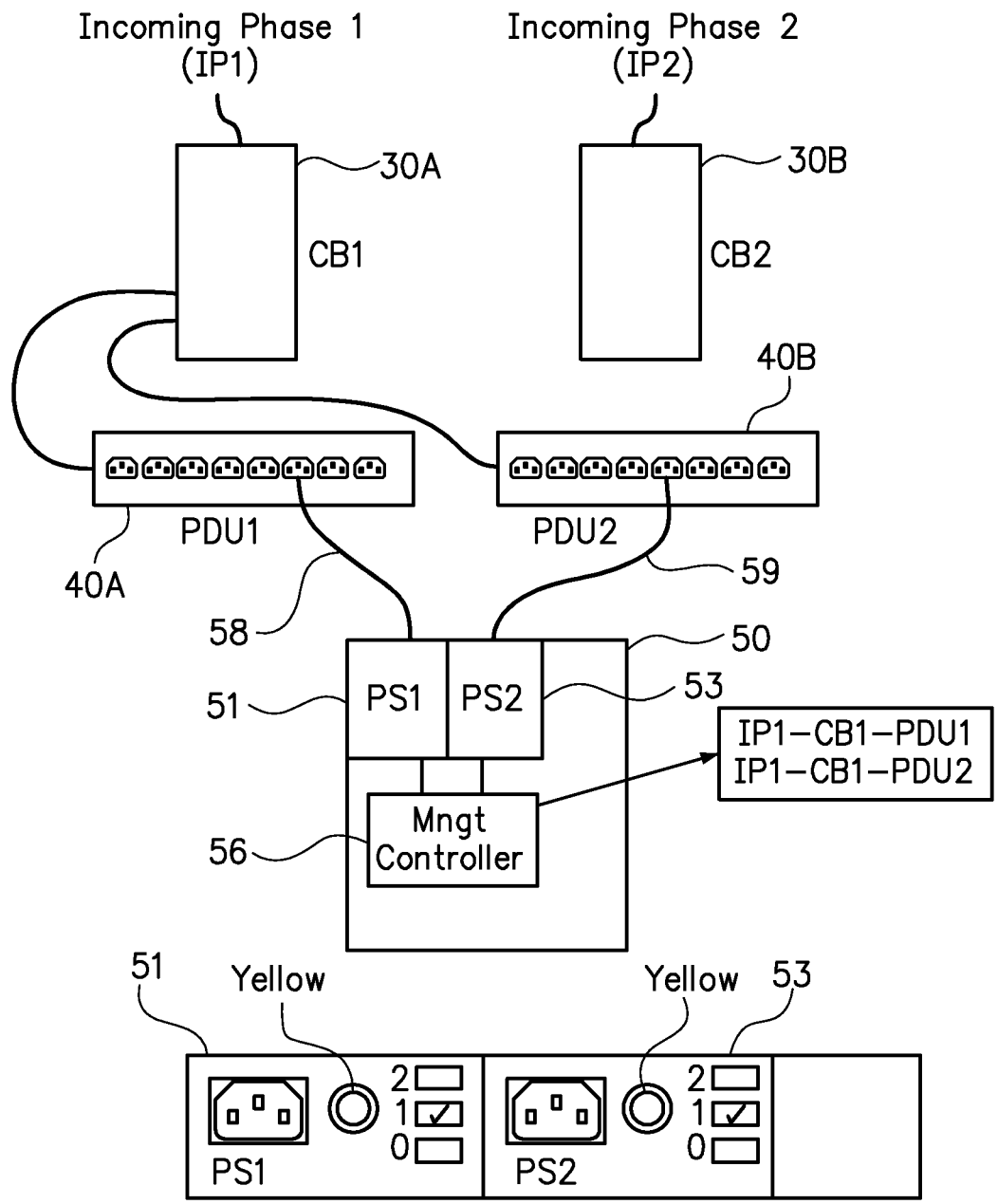
FIG. 12 is a diagram of a basic power distribution system with single phase, dual PDU redundancy.

FIG. 12 is a diagram of a basic power distribution system with single phase, dual PDU redundancy. A first power supply (PS1) receives power through a first power circuit that includes a first incoming phase (IP1), a first circuit breaker (CB1), and a first power distribution unit (PDU1). Accordingly, the management processor 56 for the electronic device 50 stores the identified first power circuit as IP1-CB1-PDU1. Similarly, the second power circuit is identified as IP1-CB1-PDU2. A comparison of the first power circuit (IP1-CB1-PDU1) and the second power circuit (IP1-CB1-PDU2) shows that the two power circuits use the same incoming phase and the same circuit breaker panel, but different power distribution units to supply power to the two separate power supplies. Accordingly, the first and second power circuits are determined to have only very limited redundancy due to the redundant PDUs. As a result, the LEDs on an two power supplies exhibit level 1 redundancy.

Figure 13:
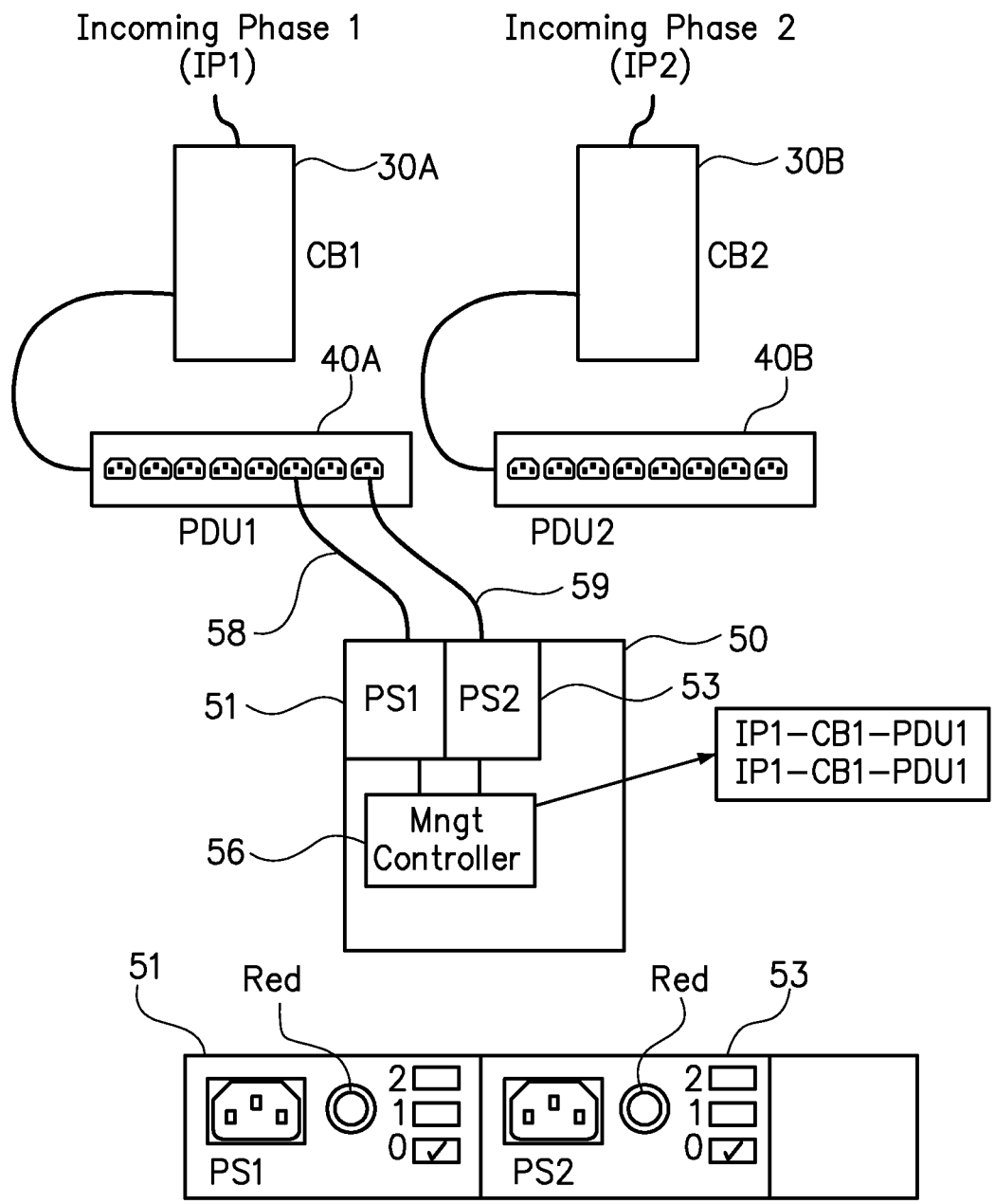
FIG. 13 is a diagram of a basic power distribution system with no redundancy, due to a single incoming phase and a single PDU.

FIG. 13 is a diagram of a basic power distribution system with no redundancy, due to a single incoming phase and a single PDU. The first power supply (PS1) receives power through a first power circuit that is identified as IP1-CB1-PDU1, and the second power circuit is identified as IP1-CB1-PDU1. Since the identification codes for the first and power circuits are the same (i.e., IP1-CB1-PDU1), there is no redundancy and the LEDs on the two power supplies exhibit level 0 (no redundancy).

Figure 14:
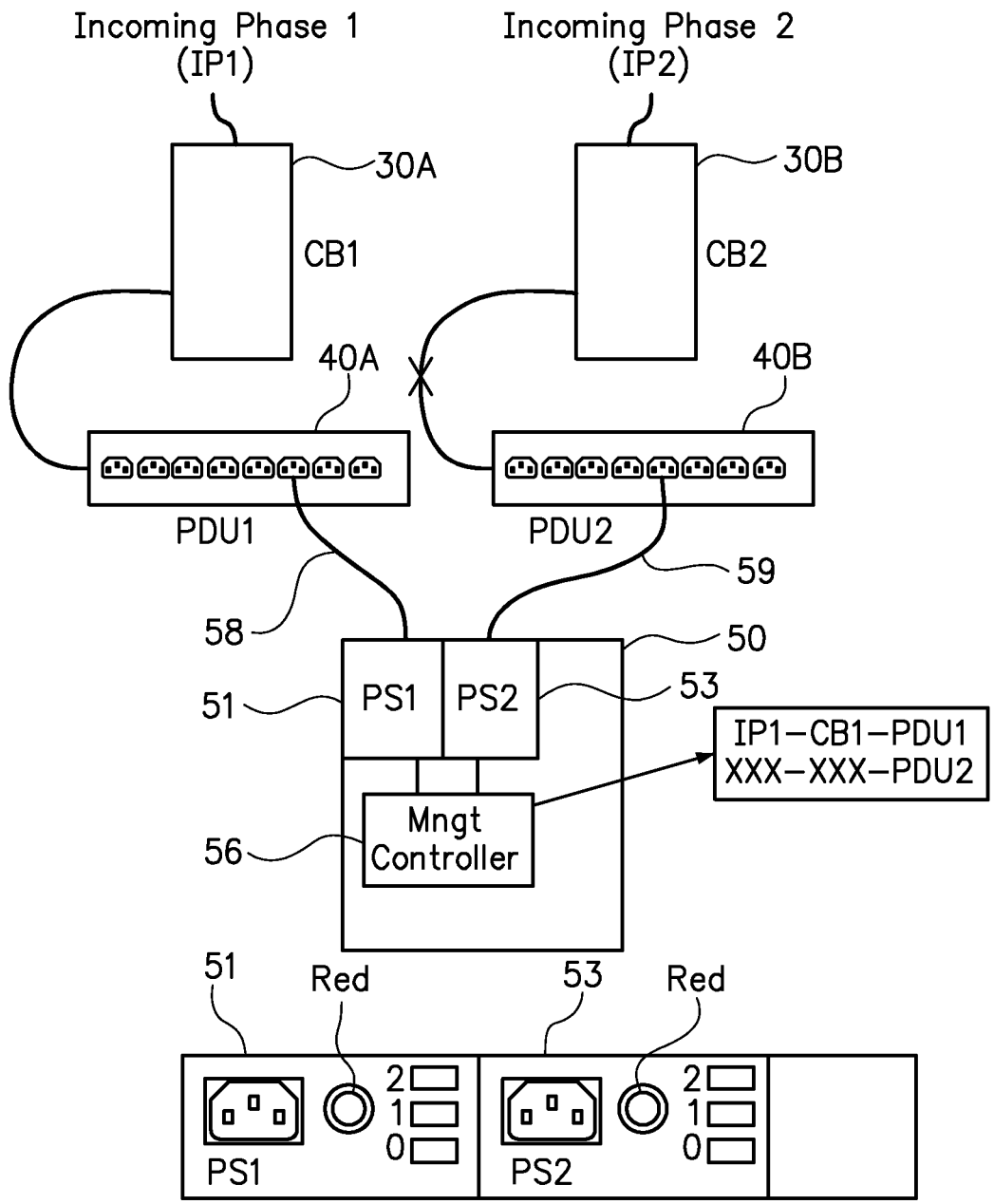
FIG. 14 is a diagram of a basic power distribution system with a broken phase wire.

FIG. 14 is a diagram of a basic power distribution system with a broken phase wire. A "broken" wire or cable includes a disconnected power supply cable. When the management controller 56 attempts to identify the path of the power circuit supplying power to the second power supply (PS2), it only receives the identification code of PDU2. Since this is an incomplete description of a power circuit, a fault consistent with a broken wire is detected.

Alternatively, management processors associated with the incoming phases, the circuit breaker panels and the power distribution units will periodically send a signal to a management processor 56 of the electronic device 50 to indicate that the first power circuit has not been broken. Such a signal may be referred to as a "keep alive" signal or a "heartbeat" indicating that the entity and the connection are still working. If the management processor 56 of the electronic device 50 has not received the keep alive in greater than a predetermined period of time, the electronic device may provide an alert signal. Such an alert signal may, for example, energize a red warning light on the power supply that is included in the power circuit associated with the alert signal. Alternatively, the alert signal may be a warning displayed on a graphical user interface of the cluster management entity.

If the electronic device previously stored the identified paths of the first and second power circuits, it is possible to identify where the broken or disconnected cable is located. This is possible because the management processor of the electronic device has the identification codes for its fully functional power circuits and can compare those identification codes with a current set of identification codes from entities in the power circuits that can still communicate with the electronic device. For example, if the management processor of the electronic device can still communicate with PDU2 in the second power circuit, but has lost communication with CB2 in that same second power circuit, then either CB2 has failed or the electrical connection between PDU2 and CB2 has been broken or disconnected.

Figure 15:
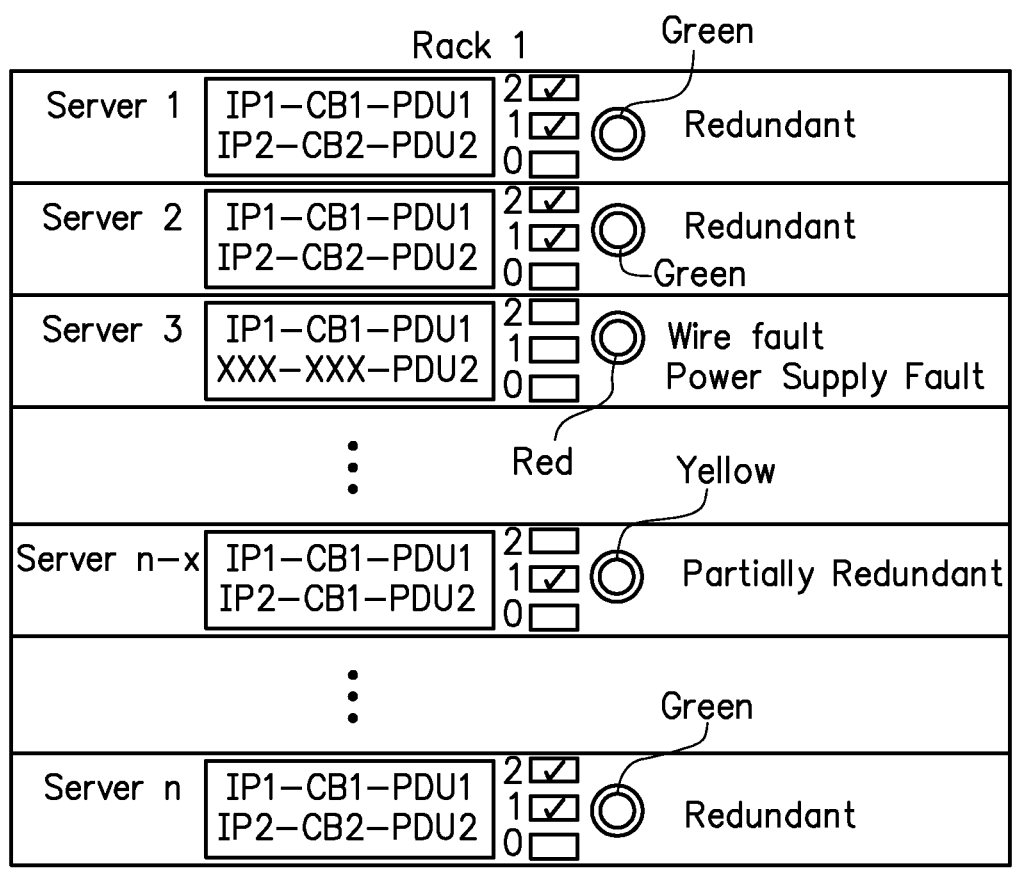
FIG. 15 is a diagram of a graphical user interface displaying information about the redundancy in the power circuits of the power distribution system.

FIG. 15 is a diagram of one example of a graphical user interface displaying information about the redundancy in the power circuits of the power distribution system. Each row identifies a server and the first and second power circuits that supply power to that server. Then, each row further shows the level of redundancy (Levels 0-2) and any further alert signal, such as a green bubble to indicate fully redundant power circuits, a yellow bubble to indicate partially redundant power circuits, and a red bubble to indicate a wire fault (broken or disconnected power supply cable) or power supply fault. Please change the LED colors on FIGS. 14 & 15

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, components and/or groups, but do not preclude the presence or addition of one or more other features, integers, steps, operations, elements, components, and/or groups thereof. The terms "preferably," "preferred," "prefer," "optionally," "may," and similar terms are used to indicate that an item, condition or step being referred to is an optional (not required) feature of the invention.

The corresponding structures, materials, acts, and equivalents of all means or steps plus function elements in the claims below are intended to include any structure, material, or act for performing the function in combination with other claimed elements as specifically claimed. The description of the present invention has been presented for purposes of illustration and description, but it is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A computer implemented method, comprising:
    identifying the path of a first power circuit to a first power supply that is connected to supply power to an electronic device, wherein the path of the first power circuit is identified as including a first power distribution unit identification code;
    identifying the path of a second power circuit to a second power supply that is connected to supply power to the electronic device, wherein the path of the second power circuit is identified as including a second power distribution unit identification code;
    communicating the first power distribution unit identification code from a power distribution unit management processor to a management processor for the electronic device;
    communicating the second power distribution unit identification code from a power distribution unit management processor to the management processor for the electronic device;
    comparing the first power distribution unit identification code to the second power distribution unit identification code to determine whether the first and second power circuits have redundant power distribution units; and
    providing an output that represents a measure of redundancy in the first and second paths to a user.

2. The computer-implemented method of claim 1, wherein the output includes a visual indicator on the first and second power supply.

3. The computer-implemented method of claim 1, wherein the electronic device is selected from a server, a network switch, and a data storage device.

4. The computer-implemented method of claim 1, wherein the paths of the first and second power circuits are each identified as a series of power entity identification codes.

5. The computer-implemented method of claim 1, wherein the paths of the first and second power circuits are each identified by an incoming phase identification code, a circuit breaker identification code, and a power distribution unit identification code.

6. The computer-implemented method of claim 5, wherein identifying the path of a first power circuit to a first power supply, includes:
    communicating, for each of the first and second power circuits, the incoming phase identification code, the circuit breaker identification code, and the power distribution unit identification code through the power circuit to the management processor of the electronic device.

7. The computer-implemented method of claim 5, wherein the first power circuit includes an incoming phase, a circuit breaker panel, and a power distribution unit that is connected to supply electrical power to the electronic device, and wherein the second power circuit includes an incoming phase, a circuit breaker panel, and a power distribution unit that is connected to supply electrical power to the electronic device.

8. The computer-implemented method of claim 1, wherein the measure of redundancy identifies whether or not the power circuit includes redundant incoming phases, redundant circuit breakers, redundant power distribution units, or a combination thereof.

9. The computer-implemented method of claim 1, wherein the path of the first power circuit is further identified as including a first circuit breaker panel identification code, and wherein the path of the second power circuit is further identified as including a second circuit breaker panel identification code, the method further comprising:
- communicating the first circuit breaker panel identification code from a circuit breaker panel management processor to the management processor for the electronic device;
- communicating the second circuit breaker panel identification code from a circuit breaker panel management processor to the management processor for the electronic device; and
- comparing the first circuit breaker panel identification code to the second circuit breaker panel identification code to determine whether the first and second power circuits have redundant circuit breaker panels.

10. The computer-implemented method of claim 9, wherein the path of the first power circuit is further identified as including a first incoming phase identification code, and wherein the path of the second power circuit is further identified as including a second incoming phase identification code, the method further comprising:
- communicating the first incoming phase identification code from a circuit breaker panel management processor to the management processor for the electronic device;
- communicating the second incoming phase identification code from a circuit breaker panel management processor to the management processor for the electronic device; and
- comparing the first incoming phase identification code to the second incoming phase identification code to determine whether the first and second power circuits have redundant incoming phases.

11. The computer-implemented method of claim 1, further comprising:
- communicating the measure of redundancy to a cluster management entity.

12. A computer implemented method, comprising:
- identifying the path of a first power circuit to a first power supply that is connected to supply power to an electronic device, wherein the first power circuit includes an incoming phase, a circuit breaker panel, and a power distribution unit that is connected to supply electrical power to the electronic device, wherein the path of the first power circuit is identified by an incoming phase identification code, a circuit breaker identification code, and a power distribution unit identification code;
- identifying the path of a second power circuit to a second power supply that is connected to supply power to the electronic device, wherein the second power circuit includes an incoming phase, a circuit breaker panel, and a power distribution unit that is connected to supply electrical power to the electronic device, wherein the path of the second power circuit is identified by an incoming phase identification code, a circuit breaker identification code, and a power distribution unit identification code;
- comparing the path of the first power circuit with the path of the second power circuit to determine a measure of redundancy in the first and second paths; and
- providing an output that represents a measure of redundancy in the first and second paths;
- wherein identifying the path of a first power circuit to a first power supply, includes:
  - communicating the incoming phase identification code from an electrical power line management processor over an electrical power supply cable to a circuit breaker panel management processor;
  - communicating the circuit breaker panel identification code and the incoming phase identification code from the circuit breaker management processor over an electrical power supply cable to a power distribution unit management processor; and
  - communicating the power distribution unit identification code, the circuit breaker panel identification code and the incoming phase identification code from the power distribution unit management processor over an electrical power supply cable to a management processor for the electronic device.

13. The computer-implemented method of claim 12, wherein identifying the path of a second power circuit to a second power supply, includes:
- communicating the incoming phase identification code from an electrical power line management processor over an electrical power supply cable to a circuit breaker panel management processor;
- communicating the circuit breaker panel identification code and the incoming phase identification code from the circuit breaker management processor over an electrical power supply cable to a power distribution unit management processor; and
- communicating the power distribution unit identification code, the circuit breaker panel identification code and the incoming phase identification code from the power distribution unit management processor over an electrical power supply cable to the management processor for the electronic device.

14. The computer-implemented method of claim 13, wherein the management processors communicate using a carrier sense multiple access protocol with collision detection.

15. The computer-implemented method of claim 13, wherein each management processor uses a transceiver coupled for communication over the power circuit.

16. The computer-implemented method of claim 12, further comprising:
- the electrical power line management processor, the circuit breaker panel management processor or the power distribution unit management processor periodically sending a signal to the management processor of the electronic device to indicate that the first power circuit has not been broken.

17. The computer-implemented method of claim 16, further comprising:
- the electronic device providing an alert signal in response to having not received the signal in greater than a predetermined period of time.

18. The computer-implemented method of claim 17, wherein the alert signal enables a warning light on the power supply that is included in the power circuit associated with the alert signal.

19. The computer-implemented method of claim 16, further comprising:
- the electronic device storing the identified paths of the first and second power circuits; and
- the electronic device providing an alert signal in response to having not received the signal in greater than a predetermined period of time, wherein the alert signal identifies a location of a disabled electrical power supply cable.

20. The computer-implemented method of claim 12, further comprising:
the electronic device sending a request for identification to each of the management processors that are connected to the first power circuit.

21. The computer-implemented method of claim 20, wherein the electronic device sends the request during startup of the electronic device.

\* \* \* \* \*